United States Patent [19]

Renau et al.

[11] Patent Number: 4,825,087

[45] Date of Patent: Apr. 25, 1989

[54] SYSTEM AND METHODS FOR WAFER CHARGE REDUCTION FOR ION IMPLANTATION

[75] Inventors: Anthony Renau, Horsham; Stephen Moffatt, Byfleet; Frederick Plumb, Horsham, all of England

[73] Assignee: Applied Materials, Inc., Santa Clara, Calif.

[21] Appl. No.: 50,586

[22] Filed: May 13, 1987

[51] Int. Cl.$^4$ .............................................. G21K 5/00
[52] U.S. Cl. .............................. 250/492.2; 250/423 R; 315/111.81
[58] Field of Search ............. 250/492.21, 423 R, 251; 315/111.81

[56] References Cited

U.S. PATENT DOCUMENTS 3,507,709  4/1970  Bowers .................................... 437/11
4,463,255  7/1984  Robertson et al. ............ 250/492.21
4,578,589  3/1986  Aitken .............................. 250/492.21
4,684,848  8/1987  Kaufman et al. ............... 315/111.81

OTHER PUBLICATIONS

Glawischnig et al., "Charging Studies in New Applied Materials Series 9000 Ion Implantation System", Jan. 1987 Nuclear Instruments publication, pp. 1–4, FIGS. 1–4.

Primary Examiner—Carolyn E. Fields
Assistant Examiner—John A. Miller
Attorney, Agent, or Firm—Flehr, Hohbach, Test, Albritton & Herbert

[57] ABSTRACT

A diode flood gun for introducing an amplified current of low energy electrons into an ion beam for neutralizing charge build up on a target such as a semiconductor wafer during irradiation by the beam. The low energy, amplified current is effected by introducing an inert gas into the flood gun.

14 Claims, 8 Drawing Sheets

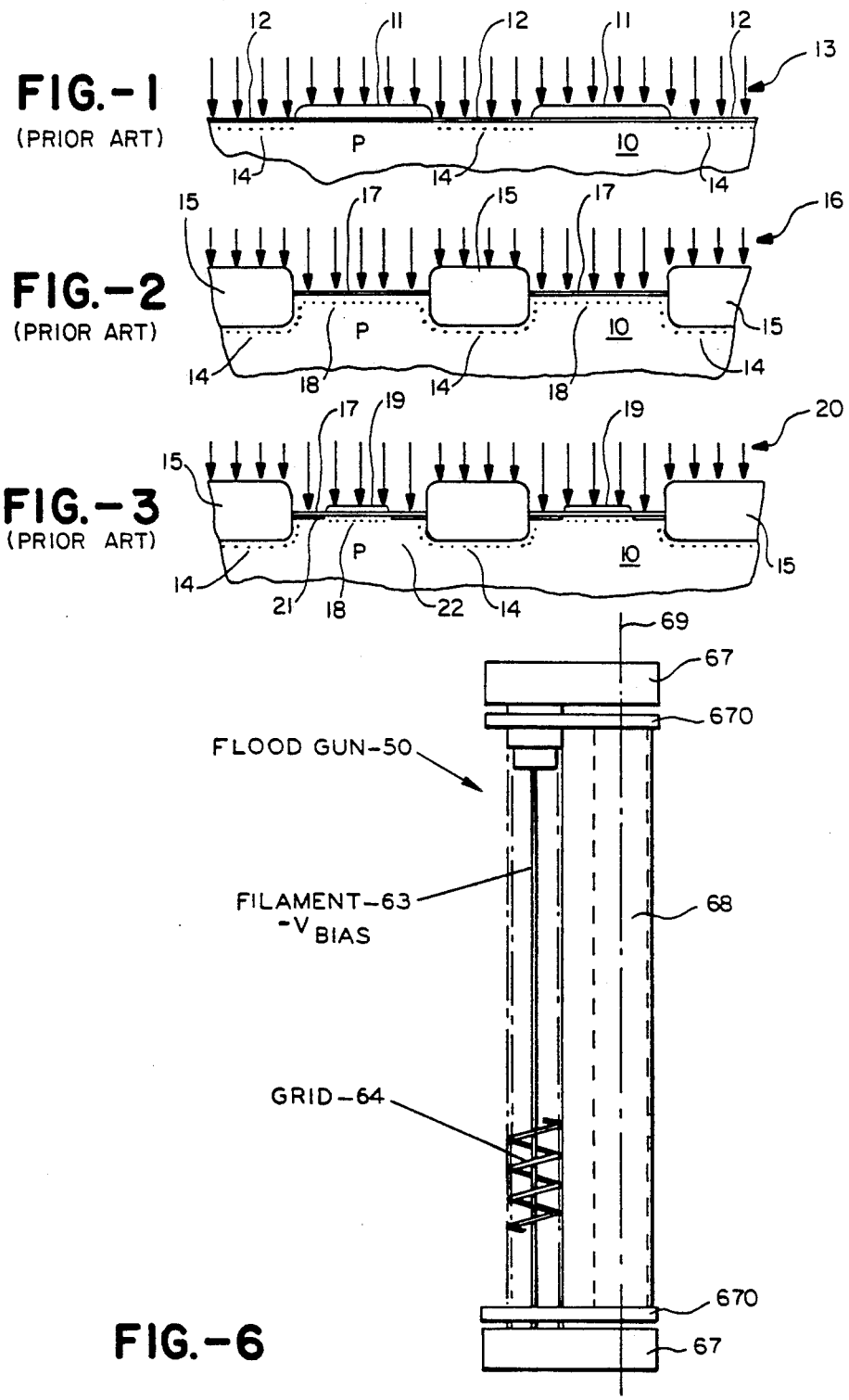

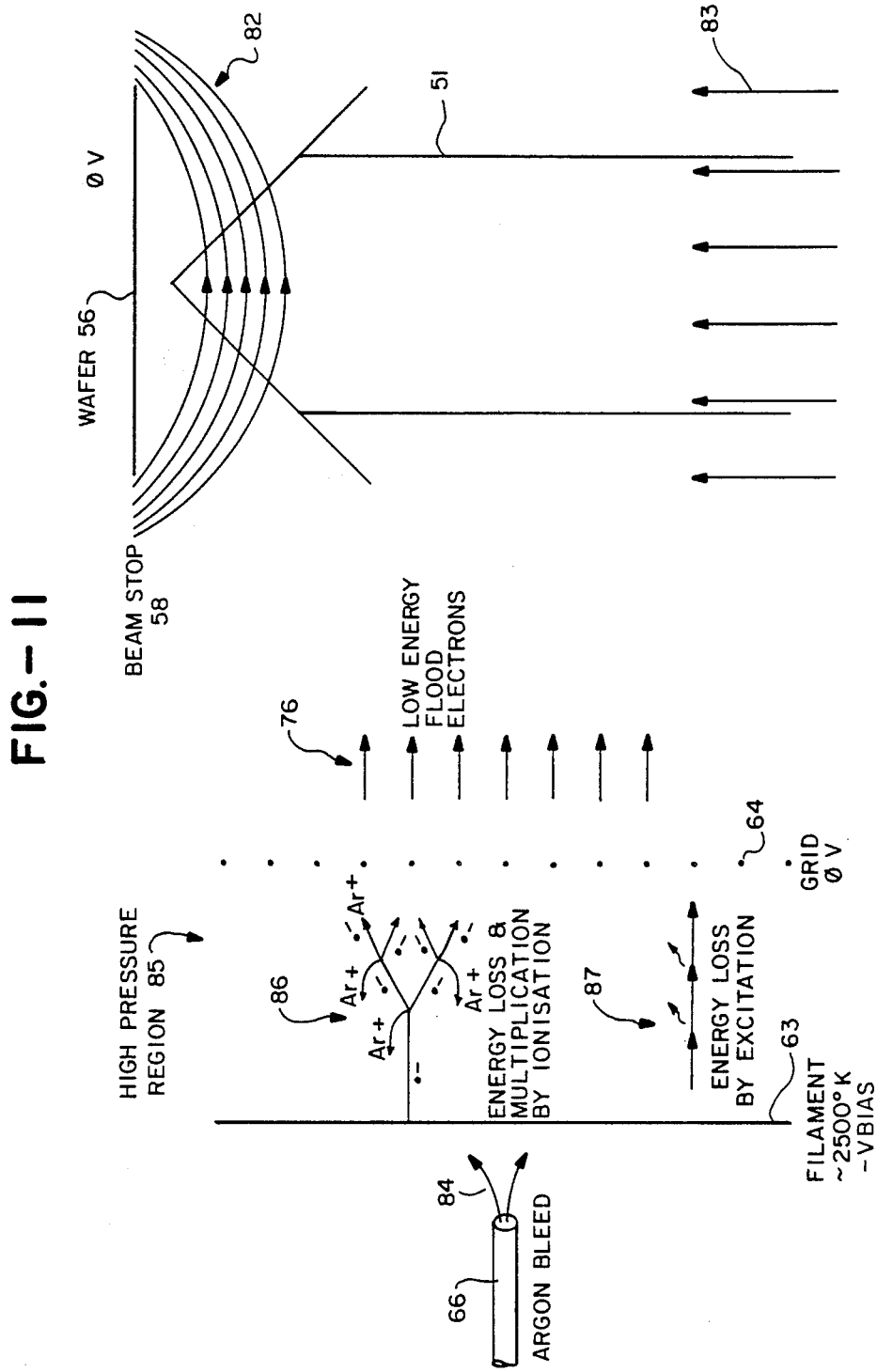

SYSTEM AND METHODS FOR WAFER CHARGE REDUCTION FOR ION IMPLANTATION

CROSS REFERENCE TO RELATED CASES

The apparatus and system and methods of the present invention are applicable to ion implantation systems such as the PI 9000 system available from Applied Implant Technology of Horsham, England, a subsidiary of the Assignee, Applied Materials, Inc. of Santa Clara, Calif. The PI 9000 system is described in Aitken U.S. Pat. No. 4,578,589, which issued Mar. 25, 1986, and is assigned to Applied Materials, Inc. This patent is incorporated by reference in its entirety.

BACKGROUND OF THE INVENTION

The present invention relates to wafer charge reduction systems for ion implanters, and to so-called electron flood guns for introducing negative charge into the ion beam to reduce positive charging of ion implanted wafers. In particular, the invention relates to an electron flood gun and to methods of operation which provide a hitherto unattainable combination of large magnitude flood electron current and low energy characteristics which are required to control or eliminate both local and bulk positive charging by the ion implant beam.

EXAMPLE OF USE OF ION IMPLANTATION

FIGS. 1-3 illustrate the use of a sequence of ion implantation steps in fabricating CIS (conductor-insulator-semiconductor) integrated circuit devices on a semiconductor wafer. FIG. 1 illustrates a first ion implantation step which may be performed on the P-type wafer 10 to produce a light implant in the field regions 14 of the wafer. The field regions 14 at this point are not covered by the region of photoresist mask 11. The photoresist 11 is formed using a standard lithography process in which a thin layer of resist is applied over the entire surface of the wafer. After the layer of resist has been exposed and developed, a thin layer of thermal oxide 12 typically is grown over the exposed surfaces of the semiconductor wafer so that the implant in the field regions 14 will be made through the thin oxide layer.

Next, the light field implantation of ions of a P-type material such as boron is done to provide greater electrical isolation between the active device regions which lie under the regions 11 of photoresist material. Then, thick field oxide regions 15 are grown using a wet oxidation process. See FIG. 2. During this oxidation process, the implanted ions 14 are driven into the semiconductor substrate to underlie the field oxide regions 15.

The mask 11 is then removed, a thin gate oxide 17 is formed in the active device regions 18, and a second ion implantation step is performed to implant N-type dopant ions 16 through the gate oxide layer 17. This light implant step creates the implanted region 18 and tailors the threshold voltage of the MOS (metal oxide semiconductor) silicon gate field effect transistor. See FIG. 3.

After this light threshold-setting implant, the silicon gate regions 19 of the field effect transistor devices are formed on the wafer to produce the device topology shown in FIG. 3. Then, a heavy implantation of N-type ions may be performed to simultaneously dope the silicon gate element 19 and the source and drain regions 21 and 22 to complete the basic structure of the silicon gate field effect transistor device. Of course, additional fabrication steps are required to complete typical integrated circuits, including additional ion implantation steps.

ION BEAM-INDUCED TARGET CHARGE-UP

The present invention is directed to device performance degradation and the concomitant decrease in yields which can result from positive charging of the target semiconductor wafer during ion implantation steps such as are described above.

Positive charging typically manifests itself in two ways, as bulk charging or as localized charging. Bulk charging occurs during ion implantation because limited charge mobility causes the whole surface to become charged. Localized charging manifests itself when conductive regions or layers (such as the gate electrodes 19 shown in FIG. 3) which are isolated from the conducting substrate by a dielectric (such as gate oxide 17, FIG. 3), charge up. The positive charge which is induced in a semiconductor wafer target during ion implantation usually can readily exceed a few volts. However, depending upon the device architecture, development of a positive charge of only a few volts magnitude on a dielectrically isolated conductor "island" such as a gate electrode 19 can create a field across the underlying dielectric which is sufficient to cause breakdown and loss of dielectric integrity and, as a consequence, render the device inoperative. While local charging can be a problem for bi-polar circuits, it presents very difficult problems for MOS and CMOS (complementary metal oxide semiconductor) circuits, more so as the technology implements thinner gate oxides and high dose implants.

To our knowledge, the prior art does not suggest an adequate solution to the positive charging problem.

Simple diode electron flood guns which introduce electrons into the ion beam have been available for some time. See, for example, Bower U.S. Pat. No. 3,507,709, issued Apr. 21, 1970. However, to be effective for contemporary and future ion implant systems, such flood guns must be able to provide low energy electrons at high current levels. This is so because, first, contemporary so-called medium current implanters and high current implanters utilize high ion implant beam current levels, within the approximate range 0.1–5 milliamps (mA) for medium current operation and 5–100 milliamps for high current operation. Clearly, effective neutralization of wafers which are implanted using such large magnitude currents requires much larger electron flood currents, current levels roughly comparable to the ion beam current.

Second, the flood electrons must have low energy in order to have sufficient "selectivity" to the wafer surface which, as mentioned, is charged positive with respect to earth or ground. Clearly, for the electrons to be attracted to the positively charged regions of the wafer surface their trajectories must be affected by the small electric fields associated with the low voltage positive charge. This can only happen if the energy of the electrons is low in comparison to the potential of the charge regions.

Unfortunately, the flood guns known to us are incapable of providing the high flux currents of low energy electrons which are necessary to neutralize wafers without device damage. In particular, the emission current is limited by space charge effects. The energy spread is small, influenced predominantly by the potential difference across the filament and the thermal distribution. Consequently, under vacuum this type of system (1)

produces electrons with unacceptably high energy concentrated in a narrow band about the filament bias voltage, $V_{bias}$, and (2) requires unacceptably high values of $V_{bias}$ to generate large quantities of flood electrons.

Regarding (1), not only are high energy electrons insufficiently selective to the relatively low voltage (<10 volts) locally charged regions of the wafer, but in fact may charge up the wafer to a high negative voltage. This merely replaces the positive charging problem with a negative charging problem with the same result, namely, breakdown and the loss of dielectric integrity.

Regarding (2), heretofore there has been no known way to provide sufficiently large quantities of flood electrons to neutralize wafer charge-up. Consider, for example, the flood gun disclosed in the above-mentioned Bower U.S. Pat. No. 3,507,709. There, the electron energy associated with the simple diode emitter is equal to the potential difference between the cathode and wafer. Col. 4, lines 45–50, thereof says energies in the range 4 to 40 eV can be produced but that optimum performance is at 4 eV. The flood gun drive characteristics can be approximated with reference to FIG. 9, which depicts the inter-dependency of bias voltage and bias current for our flood gun 50, FIGS. 4–7. Curve 91 illustrates theoretically the effect of bias voltage on bias current during operation in a vacuum. It is seen that operation at the maximum Bower level of 40 volts would provide at most inadequate quantities of flood electrons with reasonable size guns, whereas operation at the optimum 4 volt level would provide a much lower bias current, perhaps at the microamp level.

More recently, secondary electron emission from a metallic surface has been used in an attempt to neutralize positive charge build-up. Using this technique, typically the electron flux from a flood gun is aimed at the metallic surface so that secondary electron emission, presumably of lower energy, provides neutralization. In fact, however, secondary emission can also be characterized by an unacceptably large percentage of high energy electrons, as well as by difficulty in achieving consistent reproducible control of the process.

In short, to our knowledge the existing flood gun technology and the secondary electron emission technology have not afforded sufficient control of the electron energy distribution or of the neutralization process to be considered a solution to the problem of positive charging during ion implantation.

SUMMARY OF THE INVENTION

Objects

In view of the above discussion, it is one object of the present invention to prevent potentially catastrophic positive charging of semiconductor wafers during ion implantation.

It is another object of the present invention to prevent such charging by the introduction of flood electrons into the ion beam used for implanting, and without negative charge build up.

It is yet another object of the present invention to introduce flood electrons into the ion beam at a high flux/current and at low electron energies and with precise control of these and other characteristics including trajectory.

SUMMARY

In one aspect, the present invention is embodied in an electron flood gun for neutralizing positive charge induced in a target such as a semiconductor wafer by an ion beam, comprising: diode means comprising an anode and a cathode adapted for receiving a bias voltage for emitting a flux of electrons into the ion beam; means for introducing an inert gas into the region adjacent the cathode for amplifying the electron flux or current and lowering the peak electron energy to a level commensurate with the voltage level of the positive charge on the target; and means for applying an adjustable bias voltage to the cathode for controlling the electron current.

In another aspect, our invention relates to the combination of (1) a system for irradiating a target with an ion beam in a system end station comprising post-analysis electrode means for accelerating the ion beam to a given velocity incident upon a target located at a selected position downstream from the post-analysis electrode means and (2) a flood gun inserted between the post-analysis electrode means and the target position for neutralizing positive charge build-up induced in the target by the ion beam. The flood gun of this combination comprises: a spiral wire grid anode having coil turns spaced a distance selected for admitting gas therethrough; a filament cathode extending lengthwise within the grid anode and being adapted for receiving a bias voltage to stimulate the emission of electrons into the ion beam; means for introducing an inert gas through the grid anode for magnifying the flux of emitted electrons and lowering the peak electron energy to a value commensurate with the positive voltage level induced by the ion beam in the target; and means for supplying an adjustable bias voltage to the filament for amplifying the current of emitted electrons and for controlling the electron peak energy.

In still another aspect, the present invention involves the combination, with a process of implanting ions into a semiconductor wafer using an incident ion beam, of a method of neutralizing low magnitude voltage positive charge up of the wafer resulting from the ion implant process, comprising: providing an electron flood gun having a filament for directing electrons into the beam; bleeding inert gas into the flood gun for amplifying the electron current and lowering the average peak flood electron energy; and controlling the voltage applied to the electron gun filament to control the magnitude of the electron current and limit the average peak electron voltage to a value commensurate with the magnitude of the positive wafer charge.

BRIEF DESCRIPTION OF THE DRAWINGS

The above and other aspects of the present invention are disclosed with respect to the drawings, in which:

FIGS. 1–3 are schematic views of a portion of a semiconductor wafer illustrating the use of ion implantation in the monolithic integrated circuit manufacture process;

FIG. 6 is an elevation view partly in schematic of the flood gun of the present invention;

FIG. 11 is a schematic of the charge neutralization process.

DETAILED DESCRIPTION

Flood Gun Structure and Operation

Figure 4:
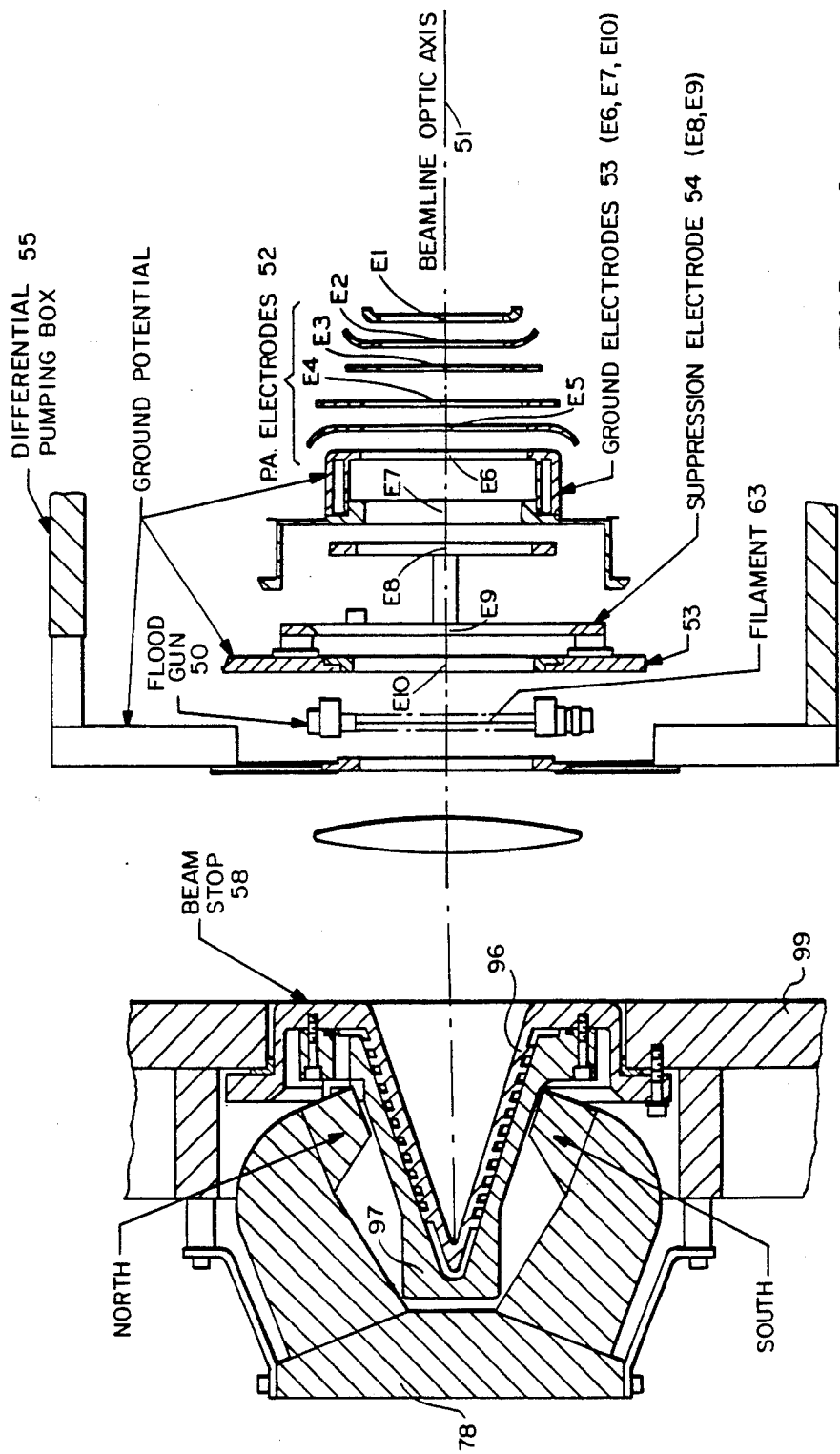
FIGS. 4 and 5 are, respectively, elevation and plan views showing the mounting of the flood gun of the present invention relative to the ion beam path in the system of FIG. 4.

FIGS. 4-7 depict a presently preferred embodiment of our electron flood gun 50 and its use in the system end station 60 of the PI 9000 Ion Implant System disclosed in the referenced Aitken U.S. Pat. No. 4,578,589.

In the system end station 60, the post-acceleration electrode means 52 (comprising six electrodes individually designated E1-E6) accelerates the analyzed ion beam along the system beam line optic axis 51, through the ground electrode means 53 (individual electrodes E6, E7, E10) and suppression electrode means 54 (electrodes E8, E9) for implanting wafers 56—56 mounted on the arms 57—57 of a scanning wheel assembly. The two suppression electrodes E8 and E9 are connected electrically in common at 0V to −30kV and, typically, −2 kV to −5 kV.

As discussed in the referenced Aitken U.S. Pat. No. 4,578,589, the scanning of the arms 57—57 consists of a combination of a linear radial "slow" scanning movement and a rotational "fast" scanning movement, relative to the fixed beam axis 51. Beam stop assembly 58 absorbs the beam when it is not intercepted by a wafer 56, or any portion of the beam which is not intercepted by a wafer 56. The beam stop assembly 58 includes a conical shaped water cooled beam stop comprising mating jackets 96 and 97 and a magnet 98, all of which are mounted as shown to end station door 99.

Flood gun 50 is inserted between electrode E10 of the ground electrode means 53 and the walls of the differential pumping box 55 closely adjacent the beam 51 and the scanned wafers 56. The ground electrode means 53, and the differential pumping box 55 are maintained at ground potential for reasons related to beam optical control, arcing, etc., which are not specifically related to this invention.

Figure 5:
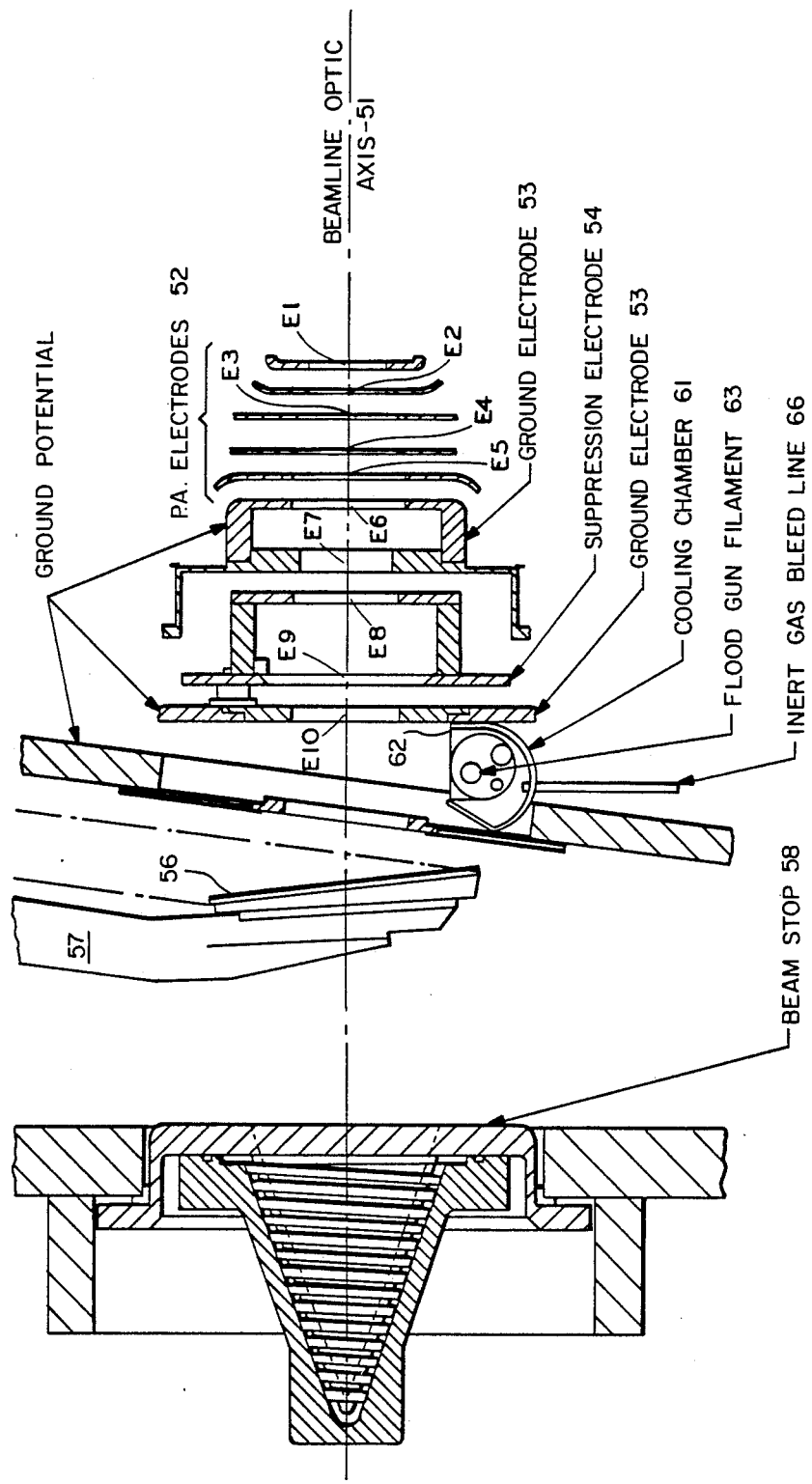
Figure 7:
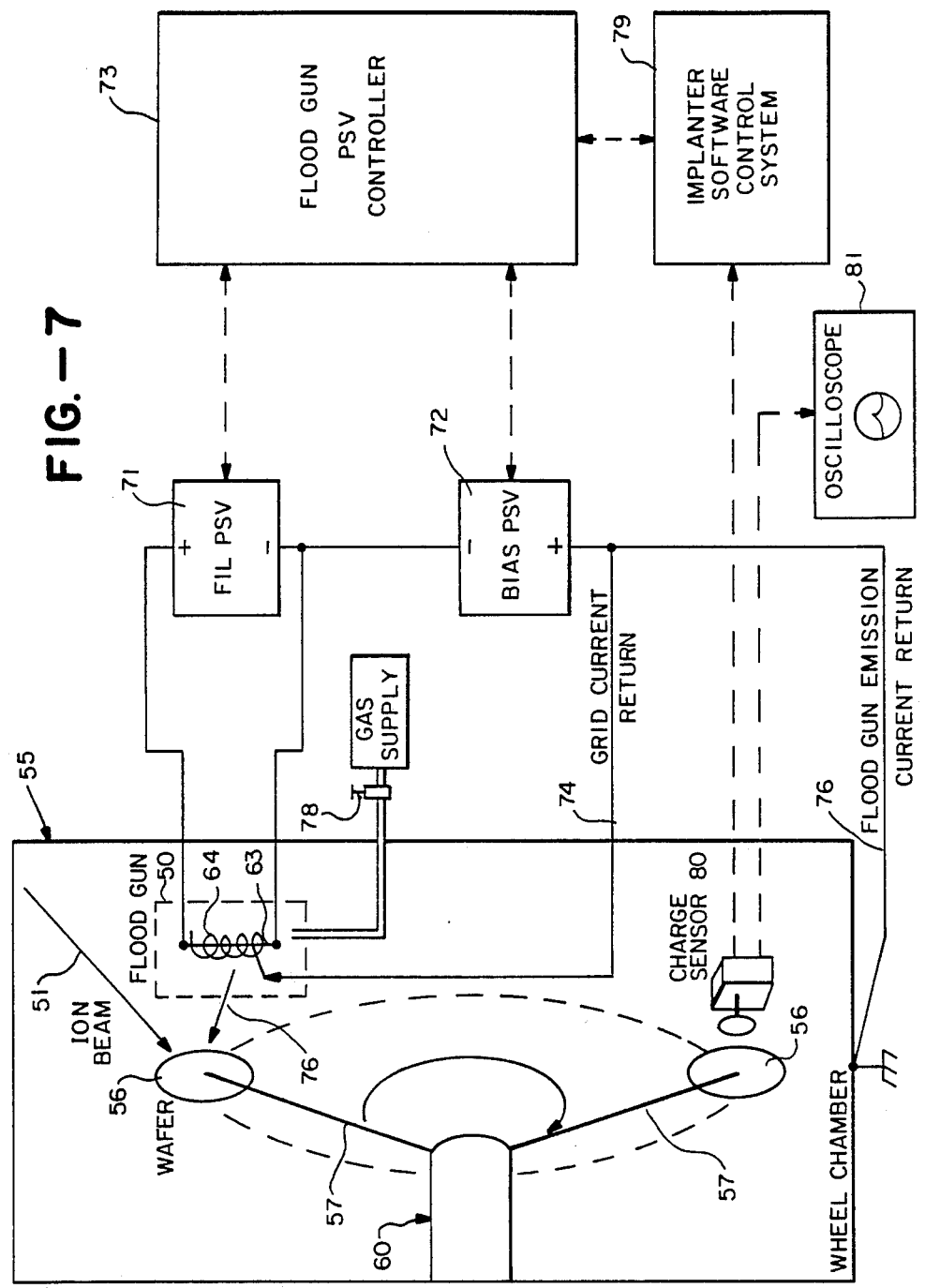
FIG. 7 is a simplified block diagram of a control system for the flood gun and the ion implant system of FIGS. 4–6.

As is perhaps best shown in FIGS. 4-6, the flood electrons are produced by a diode electron gun 50 of cylindrical geometry which is enclosed by a semi-cylindrical water-cooled cooling chamber or shield 61 (FIG. 5) having a longitudinal exit slot 62 for the electrons. (Shield 61 is not shown in FIG. 6.) The hot cathode tungsten filament 63 extends along the longitudinal axis of the cylindrical gun and is biased negatively with respect to ground at a potential of $-V_{bias}$, typically within the range 0V to −300V, by a computer-controlled adjustable power supply 72 (FIG. 7). The anode 64 is a spiral tungsten wire grid having a large open area (that is, a large distance between adjacent coil turns). Filament 63 extends along the grid's longitudinal axis. The cooling shield 61 (FIG. 5) not only absorbs radiant heat energy from the filament, but also acts as a ground electrode and collects the electrons which propagate away from the ion beam. The flood gun assembly 50 also includes a semi-cylindrical grounded electrical shield 68 for the filament and bias voltage electrical wiring.

The filament 63, grid 64 and electrical shield 68 are mounted to a pair of molybdenum end flanges 67—67 and optional graphite end heat shields 670—670 within the cooling chamber of shield 61. The resulting assembly is mounted on a support rod (not shown) which extends generally along axis 69 and is connected to the end flanges 67—67 for mounting the flood gun assembly in the ion implanter system end station 55 in the orientation and position shown in FIGS. 4 and 5.

As mentioned previously, emission from simple diode filament and grid flood guns is well known. Such simple diode guns do not satisfy the above requirements of high electron flux, low electron energy and controlled trajectory. In particular, under vacuum conventional diode-type flood gun systems produce electrons with unacceptably high energy concentrated in a narrow band about $V_{bias}$ (eV) and require unacceptably high values of $V_{bias}$ to generate sufficient quantities of flood electrons.

In contrast, our flood gun 50 incorporates gas bleed which eliminates the problems of high energy and low flood electron current. Referring particularly to FIGS. 5 and 12, inert gas such as argon is bled into the flood gun via a bleed line 66. As used here, "bleed" means the inert gas is admitted directly into the flood gun region, thereby increasing the flood gun pressure. This is done with a minimum of effect on the target chamber pressure, particularly since the differential pumping box 55 is pumped by a 10 inch cryo pump. As mentioned, the grid anode 64 has a large open area, which permits electron flow from the gun via the exit slit 62 and allows gas molecules to be readily admitted into the gun from the bleed line 66. In this improved flood gun, collisions of electrons emitted by the filament 63 with gas neutrals provide low energy electrons in large quantities and thus achieve wafer neutralization readily without harmful large magnitude negative charge build up.

FIG. 7 is a block diagram of one suitable control system for controlling the operation of the flood gun 50. As shown, and as discussed above, the flood gun 50 is mounted within the ion implant system end station 60 adjacent to the ion beam 51 for supplying flood electrons, as indicated schematically at 76, into the beam and/or onto wafers 56—56. The wafers are supported on the wafer support paddles 57—57 of a wheel assembly 60 which, as is discussed in the referenced Aitken U.S. Pat. No. 4,578,589, is mounted for scanning the wafers through the ion beam. A power supply 71 supplies current to the filament 63 for raising it to the desired electron emitting operational temperature. A second power supply 72 is connected across the filament 63 and grid 64 for biasing the filament negatively with respect to the grounded grid at a potential of $-V_{bias}$, which as mentioned, is typically within the range zero volts to −300 volts. The operation of the two variable power supplies 71 and 72 is controlled by a programmable power supply controller 73. Also, the bias power supply voltage 72 is connected in common to chamber ground along with flood gun emission current return line 76 as well as grid current return line 74. The inert gas is applied to the flood gun 50 via inlet line 66 from a gas supply reservoir 77. The gas inlet flow is regulated by a valve 78 which presently is manually operated but quite obviously could be an automatic valve operating under the control of the flood gun control system computer 73. Operation of the flood gun control system computer 73 can readily be controlled by the ion implanter's system computer 79.

In operation, with the filament at a voltage $-V_{bias}$ which preferably is within the range of −50 to −150 volts, the grid maintained at zero volts, the inert argon gas admitted at a flow rate of 0.4 atmospheric liter/hr. (typically 0.1–1 atmospheric liter/hr), a flood gun pressure of $10^{-4}$ to $10^{-1}$ mbar and an end system pressure of $10^{-7}$ to $10^{-4}$ mbar, electrons propagate from the hot filament cathode 63, colliding with the argon gas as indicated schematically at 86, FIG. 11. Each collision generates an electron/ion pair, the electron of which is accelerated toward the anode 64 (and may cause further ionization) while the ion is accelerated towards and collected by the filament 63. In short, the argon gas causes the electron current to be amplified greatly above the magnitude of the vacuum current by a mechanism which allows the total flood current to be controlled and monitored. Typical amplification is 1–10 times. The current can be maintained at the desired level by the simple expedient of controlling $V_{bias}$. The amplified flood electron current traverses from the gun exit slit 62 into the beam as a high, readily controllable current.

The second effect of the argon bleed is on the energy of the emergent electrons. As shown schematically at 86 and 87, FIG. 11, ionization and excitation mechanisms reduce the average energy of the flood electrons dramatically, typically to 5 percent to 50 percent of the bias voltage. Contemporary prior art flood guns also use relatively high bias voltage, −300V, as compared to an exemplary −100V for the present system 50. Thus, as an example, the energy of the electrons emerging from our flood gun 50 is $0.05 \times 100V = -5V$, as compared to −300V for a conventional flood gun. Like the current level, the electron energy is readily controlled. The energy level is generally an inverse function of the flow rate of argon to the gun. As a consequence, increasing or decreasing the flow rate of the inert gas decreases or increases the electron energy.

Thus, the combination of gas bleed and $V_{bias}$ give an efficient and repeatable means of controlling electron current and energy. As the electron energy is decreased, by increasing the rate of flow of the inert gas, the flood electron current increases. This current is controllable as desired and is maintained at the required level by the adjustment of $V_{bias}$.

Figure 8:
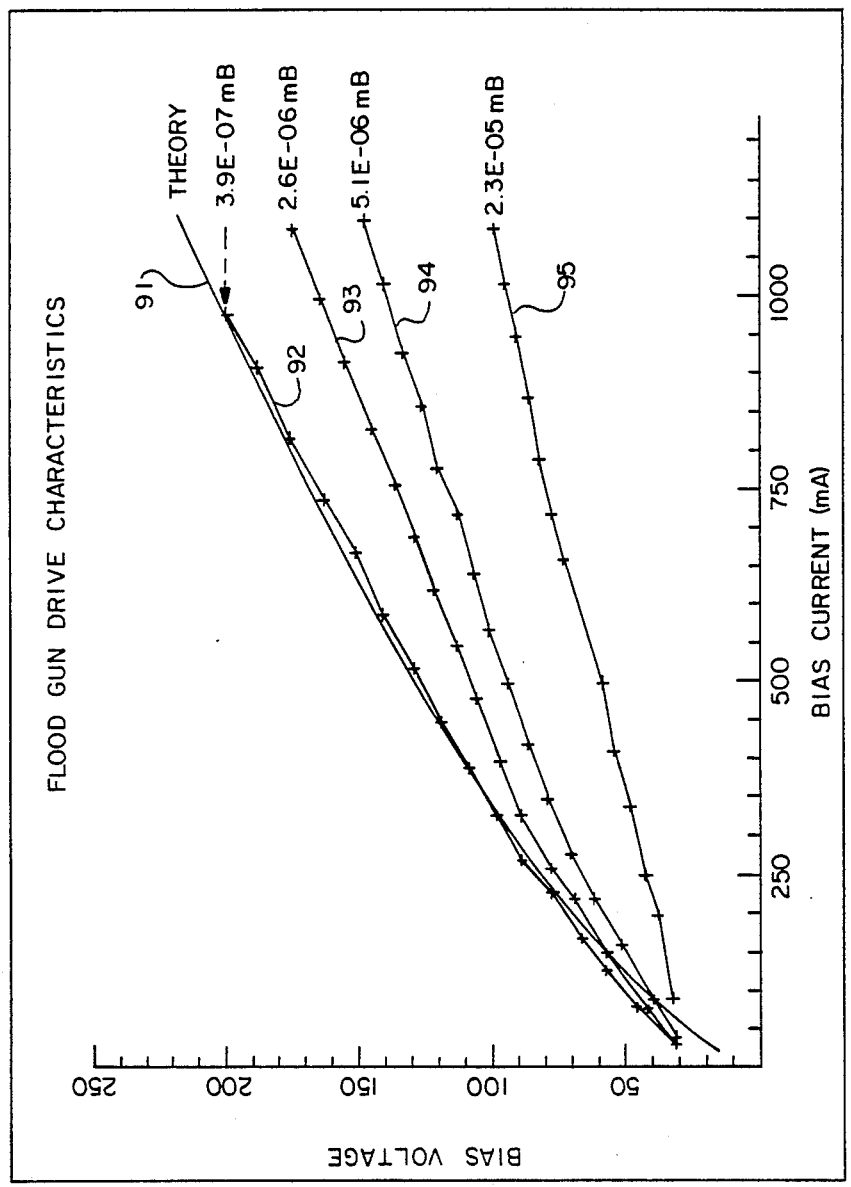
FIGS. 8–10 are graphs of various flood gun operational characteristics.
Figure 9:
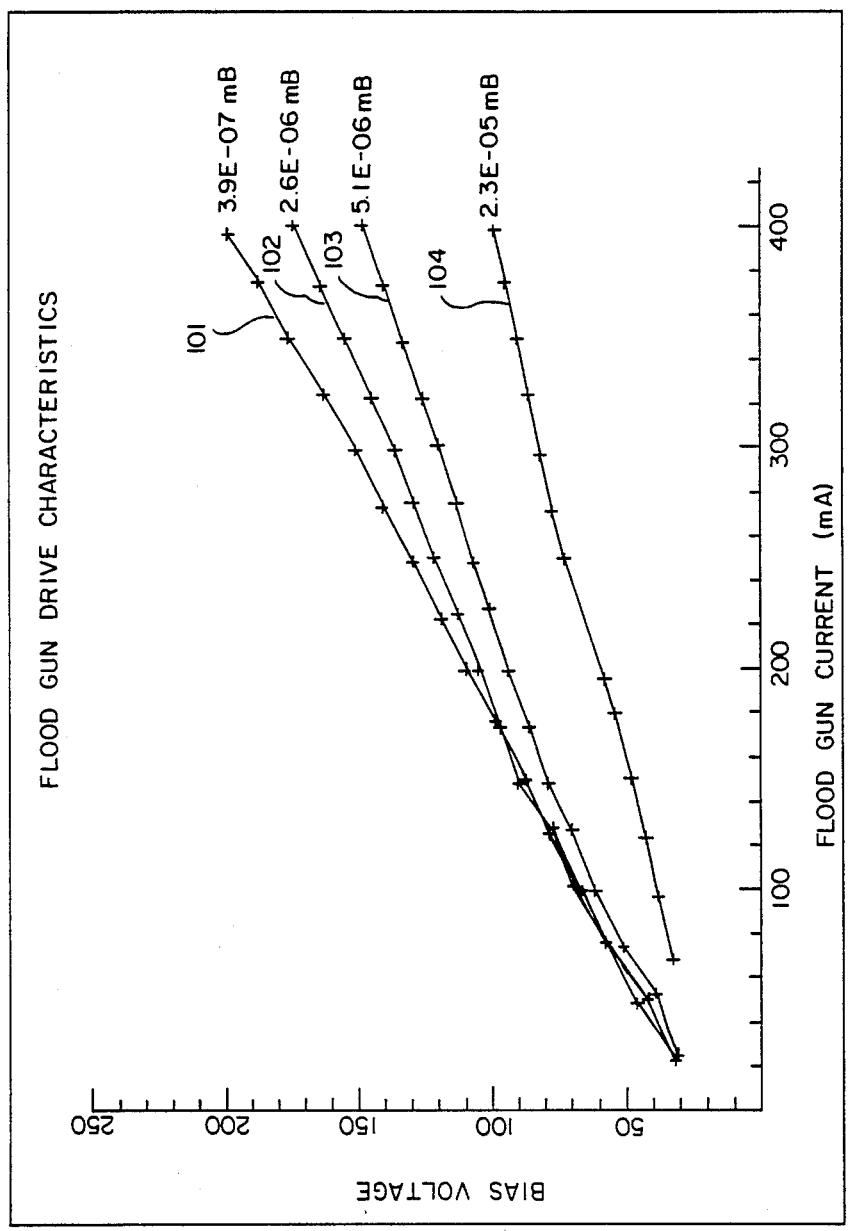
Figure 10:
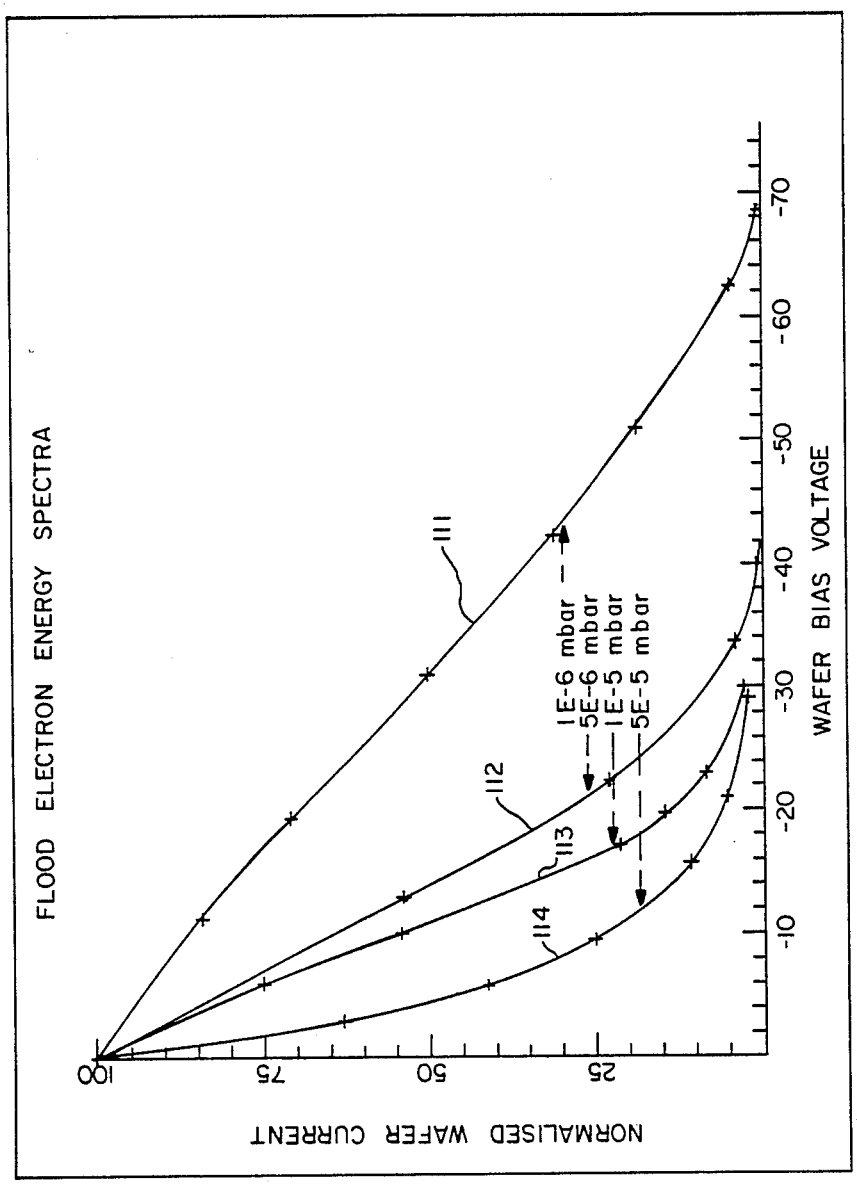

The effects of pressure on bias voltage, flood gun current and flood electron energy are shown in FIGS. 8–10. Curves 91–95 of FIG. 8 depict bias voltage as a function of internal flood gun bias current and vice versa at different flood gun pressures. Curves 101–104 of FIG. 9 depict bias voltage as a function of flood gun output current and vice versa, also at different flood gun pressures. It can be seen that increasing flood gun pressure systematically increases the bias current (FIG. 8) and flood gun output current (FIG. 9), for a given bias voltage, and that the bias current and flood gun output current (which is the amount of the total bias current which is transmitted through the grid) may be controlled over a wide range. The bias voltage for a given current may also be varied by using the gas bleed to change the flood gun pressure.

The flood electron energy spectra shown in FIG. 10 were measured by collecting the current on a negatively charged, biased wafer in the absence of an ion beam and external electric and magnetic fields. The resulting curves 111–114 illustrate the effectiveness of the increased flood gun pressure due to the inert gas in decreasing the percentage of electrons (ordinate) above a selected energy level or wafer bias voltage (abscissa). As an aid to understanding FIG. 10, consider the curve 111 associated with a pressure of 1E-6 mbar and curve 114 associated with a relatively higher pressure of 5E-5 mbar. For a wafer bias voltage of −10 volts, approximately 90 to 95 percent of the electrons have energy levels equal to or greater than the bias voltage at the lower pressure, whereas the percentage is reduced to 25 percent at the higher pressure. As evidenced by curves 111–114, the energy of the flood electrons is sequentially and greatly reduced by increasing the flood gun pressure.

It is important to realize that this inert gas mechanism for producing electrons is not dependent on secondary emission from a bombarded surface. It is not dependent on surface states which are hard to maintain in an implanter environment. Moreover, the distribution of electron energies does not have a high (primary) energy peak.

FLOOD GUN CONTROL SYSTEM

1. Filament Control

The filament is controlled by the bias voltage, $V_{-bias}$. Advantageously, if the filament is sufficiently hot ($\geq \sim 2500°$ K. for a tungsten filament), emission is predominantly limited by space charge effect and hence by the bias voltage. Preferably, the filament current is kept constant during an implant to maintain the flood electron emission level constant. When the gun is filament temperature limited, the emitted current depends on bias voltage and filament temperature. At sufficiently high temperatures, the emission depends only on bias voltage. We seek to operate flood gun 50 slightly above the temperature limited regime so that emission is only dependent on bias voltage.

However, filament control is not simply a matter of maintaining a constant value of $V_{bias}$, but involves as well the consideration of several competing factors. First, as the filament wears and its size reduces, a lesser current is required to achieve a given emission temperature. Secondly, high filament currents reduce the filament lifetime. Also, a magnetic field is generated by the current flowing through the filament which affects the electron trajectory and consequently the efficiency at which the emitted current can be transmitted through the grid (the ratio of bias current to flood current). Generally, this efficiency is highest when the filament current is low.

Taking into consideration the above factors, the optimum filament current is the lowest filament current which achieves the required emission levels. This current level provides an optimum combination of electron current and operating efficiency, without undue reduction of the filament lifetime.

In one presently preferred working embodiment, a 0.5 millimeter diameter tungsten filament 63 is used, the target emission temperature is 2500° kelvin, and the nominal filament current required to achieve this emission temperature is 17.5 amps. Implementation of the above objectives is achieved using the filament current controller and bias voltage controller as follows. Initially, the filament current is set at the desired value of 17.5 amps. Then, the filament current is reduced in small decrements while the bias voltage $V_{bias}$ is adjusted to maintain the flood gun current constant. At the same time, $V_{bias}$ is monitored. An increase in $V_{bias}$ as the result of the decrement in filament current indicates that the filament current has gone through an optimum value and the onset of a thermally limited regime. That is, emission has become thermally limited. The filament current is then reset to it next previous value, to the value before the decrement which resulted in the increase in the bias voltage $V_{bias}$. The current is maintained at this level by adjusting $V_{bias}$ as necessary.

2. Bias Voltage

As discussed in the previous section, the filament control system is designed to provide a flood gun current at a constant level which is consistent with the maximum operating efficiency and filament lifetime and independent of external changes. This is done by raising and lowering the bias voltage $V_{bias}$.

However, during the course of an implant the flood gun pressure typically will rise from the initial value, for example, due to out-gassing from the wafers during implantation. This is particularly true where polymer photoresist masks are used. Photoresist may outgas hydrogen and nitrogen into the vacuum system as a pressure burst of ions which at least temporarily increases the ambient pressure at the flood gun. If the bias voltage were maintained constant, such increases in pressure would cause higher flood gun currents and, possibly, would increase the flood gun current above the optimum range.

However, in establishing this desired filament current level as described in the previous section, the filament controller sets up the system at the beginning of the implant when the flood gun pressure is at a minimum and, as a result, emission from the flood gun is not limited by the filament temperature. Since emission is not temperature limited, the flood gun current can be decreased by decreasing the bias voltage. Thus, as the pressure increases the bias voltage can be reduced to maintain a constant gun current and to keep the flood electron-energy as low as possible.

3. Flood Gun Pressure; Dosimetry Error

Because of the relatively high pressure range which is used during operation of the flood gun 50 (<5E-5 mbar), the mean energy of the flood electrons is reduced when pressure is increased and/or when the bias voltage required to generate a particular gun current level is reduced. However, excessive target chamber pressure (>2E-5 mbar) can cause significant beam neutralization which causes unacceptable dosimetry errors.

The excessive pressure threshold for given operating conditions may be determined by monitoring the beam current on the beam stop 58 while the pressure is increased. The pressure or bleed gas feed rate which causes an unacceptable reduction in beam current can then be used as the maximum value for the flood gun operating pressure range.

Once the allowable operating range for the flood gun pressure is established, the flood gun pressure may be controlled in any one of several ways.

Presently, a manually-operated needle valve (FIG. 7) is incorporated into the bleed line 66.

Alternatively, an automatic constant pressure controller (not shown) can be appropriated into the system to control the bleed gas flow in response to pressure variations monitored by a pressure gauge located in the target chamber or, for greater accuracy, off the differential pumping box.

Still another alternative approach for controlling the flood gun pressure involves the use of an automatic constant energy controller. This approach would use a small electron collector plate mounted on the side of the flood gun 50 away from the beam. The operator would specify a peak flood electron energy, E(eV). The system then control the pressure to keep a given percentage such as 99 percent of the flood electrons at an energy below the selected peak value. The electron current arriving at the collector is monitored as the collector is pulled alternatively to ground and a negative voltage, e.g., −100V. If $I_e$ and $I_o$ are, respectively, the currents measured when the collector is biased negatively and when it is grounded, then the requirement is that $I_e/I_o \leq 0.01$. If the measured ratio is too high, then the controller would increase the gas flow rate. Conversely, if the ratio were low, the flow rate would be decreased. At no time is the flow rate be permitted to exceed the maximum for neutralization described earlier.

4. Emission Temporal Control

It is desirable to operate the flood gun only when the ion beam is incident on a wafer. This prevents negative charge damage due to flood electrons irradiation in the absence of an incident ion beam.

In addition, the PI 9000 Ion Implanter System disclosed in the referenced Aitken U.S. Pat. No. 4,578,589 periodically measures the ion beam dosage. It is desirable to interrupt the operation of the flood gun during this measurement to prevent error in the reading. Specifically, the beam current is measured by the PI 9000 software at the end of each slow scan. The reading is initiated by a signal from a sensor on the linear transducer attached to the slow scan arm indicating that the wafer is at its most distant position from the ion beam.

According to the present invention, this so-called min-scan signal is also used to temporarily terminate the operation of the flood gun during the dosimetry reading process. That is, when the ion implanter and the flood gun are being operated, the bias controller monitors the linear transducer output. When the signal is received from the min-scan sensor indicating the wheel is at the min-scan position, the bias controller drops $V_{bias}$ to zero, thereby stopping the emission of electrons while the beam current is measured. Then, as the next scan commences and the wheel arm moves off the min-scan sensor, the min-scan signal is terminated and the bias controller responsively restores $V_{bias}$ to operate the flood gun during the next wafer scan.

Alternatively, the following temporal control approach may be used not only to disable flood emission during measurement of the wafer beam but also to disable flood emission when an ion beam is not impinging on a wafer.

This alternative approach uses capabilities which are incorporated in the PI 9000 implanter. First, the voltage output from the linear transducer on the slow scan arm depends upon position of the wafer (more precisely, on the center of rotation of the wafers) with respect to the beam line optic axis. This voltage output may be translated by the implanter software into the distance from the beam line optic axis.

Second, the implanter may include a beam profiler which measures beam current density distributions across a plane in front of the beam stop 58 and behind the wafer implant position shown in FIGS. 4 and 5. This profiler comprises five faraday cups located on an arm which is pivoted above the beam stop 58. The arm is reciprocally driven by a stepper motor through the beam line optic axis 51. The associated cup currents are recorded at each step. In this way, the beam current density distribution may be measured along five arcs through the beam. This data can be processed by a local processor located in the target chamber as well as by the main system software to provide the beam size and position relative to the beam line optic axis.

Based upon the voltage output from the linear transducer associated with the slow scan arm, the position of the edges of the beam may be translated by the software into two voltages which define the positions of the wafer corresponding to the opposite edges of the beam and the position of the wafer as it enters and leaves the beam during the slow (radial) scan. These voltages are stored in the memory of the flood gun bis controller. Then, in the same way that flood emission is disabled when the wheel is at the min-scan position, the bias controller disables emission except when the linear transducer output is between the limiting voltages corresponding to the opposite edges of the beam. As a consequence, the flood gun is operated only when the wafer is positioned between the outer edges of the beam. Flood emission is, thus, disabled (1) when the wafer is at the min-scan position and the ion beam is being measured, and (2) whenever the beam is not incident upon the wafer. As mentioned, these two flood emission interrupts are used, respectively, to decrease errors in the dosimetry calculations and to reduce the likelihood of negative charge damage to the wafer.

5. Trajectory Control; Summary of Charge Neutralization

The trajectories of flood electrons are controlled and the emission of secondary electrons is suppressed by the electric field generated by suppression electrodes E8 and E9 and by the magnetic fields generated by the magnet 98 in the beam stop 58.

Specifically, the beam stop magnet 98, FIG. 4, generates a magnetic field 82, FIG. 11, between the two poles of the magnet generally transverse to the beam line optic axis 51. This transverse magnetic field forces the secondary electrons emanating from the beam stop 58 to return to the beam stop and thereby prevents these secondary electrons from affecting the measured beam current. In addition the magnetic field 82 inhibits the flow of flood electrons to the wafer, so that, in the absence of an ion beam and the electric field generated by the suppression electrodes E8 and E9, negligible electron current is transmitted to the wafer. In the unlikely event of the beam dropping out during an implant this system thus is prevented from inducing significant negative charging of the wafer.

A potentially variable negative voltage $V_{supp}$ is applied to the suppression electrodes E8 and E9 so that the resulting electrostatic suppression field 83 prevents secondary electrons created by the beam 51 impinging upon the wafer 56 or paddle 57 from entering the post-acceleration system. Also, in conjunction with the external magnetic field 82 developed by the beam stop magnet and the internal electric field of the beam 51, this electrostatic suppression field 83 precisely controls the trajectories of the flood electrons, directing the flood electrons to the wafer 56. By varying $V_{supp}$ applied to the suppression electrodes E8 and E9 to vary the suppression electric field 83, the user is able to control the flood electron trajectories, and optimize the elimination of positive charge on wafer device structures.

Referring further to FIG. 11, the overall charge neutralization system and methodology employed in our present invention can now be summarized as follows. Inert gas inlet from line 66 flows through the grid 64, as indicated by arrows 72—72, and creates a high pressure region 73 of inert gas within the flood gun 50. High energy electrons emitted by the filament 63 collide with the argon gas and thereby undergo energy loss and multiplication by ionization, as indicated schematically at 74. The electrons also experience energy loss by excitation, as indicated schematically at 75. The result is a highly amplified flow of low energy flood electrons which propagate past the grid and through the surrounding lower pressure region, as indicated at 76, and which are pulled into the ion beam by its associated electric field. There, the internal ion beam field in combination with the electric field 71 applied by the suppression electrodes sweep the flood electrons toward the wafer. At the same time, the magnetic field 70 generated by the beam stop magnet prevents secondary electrons from the beam stop from affecting the measured beam current and inhibits the flow of flood electrons to the wafer in the event the beam drops out during implantation, while the electric suppression field 71 prevents secondary electrons generated at the wafer paddle from entering the post-acceleration system.

6. Charge Sensor

Referring to FIG. 7, a charge sensor 80 is mounted on the slow scan arm so that its position with respect to the wafer locus is constant. The PI 9000 system uses capacitive coupling to provide an output which is approximately proportional to the mean wafer surface potential. The peak voltage may be written to a sample and hold buffer. Software in system computer 79 may read this buffer and then reset to allow for subsequent readings. The peak wafer potential may, therefore, be monitored during an implant. Also, the output from the charge sensor may be monitored on an oscilloscope 81.

Thus, there has been described preferred and alternative embodiments of our flood gun and the method of operating the flood gun. The flood gun was conceived with respect to an ion implantation system and, in particular, a system for ion implanting silicon integrated circuit wafers. However, the flood gun is applicable as well to other implantable materials in addition to silicon including but not limited to glass, quartz, gallium, arsenide and silicon on sapphire. In addition, the principles disclosed here are applicable to the application of flood guns, for example, to plasma etching of electronically programmable read-only memories (EPROM's) and other structures and, in more general terms, wherever it is desired to use electrons or an ion beam to control the charge level associated with or induced by another ion or electron beam used in irradiation processing equipment.

What is claimed is:

1. In combination with a system for irradiating a wafer-like target with an ion beam in a system end station comprising post-analysis electrode means for accelerating the ion beam to a given velocity incident upon a target located at a selected position downstream from the post-analysis electrode means, a flood gun inserted between the post-analysis electrode means and the target position for neutralizing positive charge build-up induced in the target by the ion beam, the flood gun comprising: a spiral wire grid anode having coil turns spaced a distance selected for admitting gas therethrough; a filament cathode extending lengthwise within the grid anode for receiving a bias voltage to stimulate the emission of electrons into the ion beam; means for introducing an inert gas through the grid anode for magnifying the flux of emitted electrons and lowering the peak electron energy to a value commensurate with the positive voltage level induced by the ion beam in the target; and means for supplying an adjustable bias voltage to the filament for amplifying the current of emitted electrons and for controlling the electron peak energy.

2. The combination of claim 1, wherein the inert gas is argon.

3. In combination with an ion implantation system for irradiating a target including a semiconductor wafer with an ion beam, an electron flood gun for neutralizing positive charge induced in the target by the ion beam, comprising: a cylindrical anode having openings therein for admitting gas therethrough; a filament cathode extending lengthwise within the anode for receiving a bias voltage to stimulate the emission of electrons into the ion beam; means for introducing an inert gas through the openings in the cylindrical anode for magnifying the flux of emitted electrons and lowering the peak electron energy to a value commensurate with the positive voltage level induced by the ion beam in the target; and means for supplying an adjustable bias voltage to the filament for amplifying the current of emitted electrons and for controlling the electron peak energy.

4. The combination of claim 3, further comprising means for generating a magnetic field at the target generally transverse to the ion beam for selectively inhibiting flow of flood electrons to the target.

5. The combination of claim 4, wherein the inert gas is argon.

6. In combination with the process of implanting ions into a semiconductor wafer using an incident ion beam, the method of neutralizing low magnitude voltage positive charge up of the water resulting from the ion implant process, comprising: providing an electron flood gun comprising an anode configured as a cylinder and having openings in the cylinder for admitting gas therethrough and a filament cathode extending lengthwise within the cylinder anode for directing electrons into the beam; bleeding inert gas through the cylinder anode into the flood gun for amplifying the electron current and lowering the average peak flood electron energy; and controlling the voltage applied to the electron gun filament to control the magnitude of the electron current and limit the average peak electron voltage to a value commensurate with the magnitude of the positive wafer charge.

7. The process of claim 6, further comprising the steps of setting the filament current to a value just sufficient to provide the requisite electron emission level and electron current, to provide an optimum combination of electron current magnitude, operating efficiency and filament lifetime.

8. The process of claim 7, further comprising the steps of preliminarily setting the filament current at an initial value which provides the requisite electron emission level and flood electron current; reducing the filament current decrementally while adjusting the bias voltage applied thereto to maintain said electron current at a relatively constant value; monitoring the bias voltage while reducing the filament current to detect an initial increase in the bias voltage in response to a decremental increase in the filament current; returning the filament current to a selected previous value before the bias voltage increase-causing decrement; and operating the flood gun simultaneously while directing the ion beam onto the wafer and adjusting the bias voltage to maintain the filament current and flood gun electron current at said selected previous value.

9. The process of claim 8, wherein during said flood gun operation, the bias voltage is reduced to offset increases in the flood gun ambient pressure.

10. The process of claim 9, further comprising determining a pressure threshold value which provides a minimum acceptable beam current and, during operation of the flood gun, monitoring the ambient flood gun pressure and maintaining said pressure below said threshold value.

11. The process of claim 10, further comprising determining the percentage of emitted electrons which fall below a maximum acceptable average peak energy; mounting an electron collector adjacent the flood gun for providing a signal proportional to the electron current incident on said collector; determining the electron current $I_o$ when the collector is grounded; and monitoring the electron current $I_e$ with the collector biased negatively during operation of the flood gun and determining when the ratio $I_o/I_e$ falls below a selected percentage; and responsively decreasing the pressure to provide the selected percentage.

12. The process of claim 6, further comprising periodically sampling the ion beams to determine the beam current; and terminating flood gun operation during said sampling.

13. The process of claim 6, further comprising monitoring the position of the wafer relative to the opposite edges of the ion beam; and disabling flood gun operation when the wafer position is outside said opposite edges of the beam.

14. In combination with the process of irradiating a target using an ion beam having an ion beam line axis, the method of neutralizing undesirable charge-up of the target resulting from the irradiation process, comprising: providing a flood gun adjacent the ion beam line axis having a filament surrounded by a grid anode for directing electrons into the beam; applying a current through the filament and a voltage between the filament and grid anode for generating charged particles directed into the ion beam; supplying inert gas at a selected pressure to the gun to amplify the current of charged particles and lower the average energy of the charged particles; controlling said energy and current levels by controlling the voltage between the filament and anode; applying an electric field along the direction of the beam line axis for directing flood electrons onto the target; adjusting the bias voltage to control the flood electron current emanating from said flood gun; and further comprising the step of applying a magnetic field transverse to the ion beam and across said target for inhibiting the flow of flood electrons to the target in the absence of an ion beam and for preventing secondary electrons emanating from the target from reaching the beam.

* * * * *